US008149165B2

(12) United States Patent
Spiegel et al.

(10) Patent No.: US 8,149,165 B2
(45) Date of Patent: Apr. 3, 2012

(54) CONFIGURABLE ANTENNA INTERFACE

(75) Inventors: Solon Jose Spiegel, Tel Aviv (IL); Vered Bar Bracha, Hod Hasharon (IL)

(73) Assignee: QUALCOMM, Incorporated, San Diego, CA (US)

( * ) Notice: Subject to any disclaimer, the term of this patent is extended or adjusted under 35 U.S.C. 154(b) by 303 days.

(21) Appl. No.: 12/512,956

(22) Filed: Jul. 30, 2009

(65) Prior Publication Data

US 2011/0025431 A1 Feb. 3, 2011

(51) Int. Cl.
*H01Q 3/00* (2006.01)
*H03H 7/20* (2006.01)

(52) U.S. Cl. ........................................ 342/372; 333/139

(58) Field of Classification Search .................. 333/139; 342/372
See application file for complete search history.

(56) References Cited

U.S. PATENT DOCUMENTS

| | | | | |
|---|---|---|---|---|
| 5,644,260 | A * | 7/1997 | DaSilva et al. | 327/238 |
| 5,745,075 | A * | 4/1998 | Enge et al. | 342/367 |
| 5,818,385 | A * | 10/1998 | Bartholomew | 342/372 |
| 6,411,256 | B1 | 6/2002 | Lier et al. | |
| 6,909,886 | B2 * | 6/2005 | Magnusen et al. | 455/307 |
| 7,088,232 | B2 * | 8/2006 | Wetmore | 340/538 |
| 7,088,765 | B1 * | 8/2006 | Green et al. | 375/142 |
| 7,164,324 | B2 * | 1/2007 | Guebels | 331/117 FE |
| 7,830,954 | B2 * | 11/2010 | Welz et al. | 375/219 |
| 2003/0119473 | A1 * | 6/2003 | Smith et al. | 455/326 |
| 2004/0061544 | A1 * | 4/2004 | Watanabe et al. | 327/359 |
| 2004/0252055 | A1 * | 12/2004 | Thomas et al. | 342/372 |
| 2005/0221775 | A1 * | 10/2005 | Abdelli | 455/189.1 |
| 2008/0020728 | A1 * | 1/2008 | Zhuo et al. | 455/313 |
| 2008/0122538 | A1 * | 5/2008 | Park et al. | 330/253 |
| 2008/0136555 | A1 * | 6/2008 | Schmidhammer | 333/129 |
| 2008/0157900 | A1 * | 7/2008 | El Rai et al. | 333/139 |
| 2009/0102576 | A1 * | 4/2009 | Okabe | 333/26 |
| 2009/0160576 | A1 * | 6/2009 | Dent | 333/139 |
| 2009/0212872 | A1 * | 8/2009 | Chang et al. | 330/301 |

FOREIGN PATENT DOCUMENTS

| | | | |
|---|---|---|---|
| EP | 0505765 A2 | | 9/1992 |
| GB | 2296613 A | * | 7/1996 |

OTHER PUBLICATIONS

International Search Report and Written Opinion—PCT/US2010/044031, International Search Authority—European Patent Office—Nov. 18, 2010.

* cited by examiner

*Primary Examiner* — Thomas Tarcza
*Assistant Examiner* — Frank McGue
(74) *Attorney, Agent, or Firm* — Ramin Mobarhan

(57) ABSTRACT

Techniques for interfacing a set of active elements with an antenna array. In one exemplary embodiment, the active elements include a plurality of signal paths, each signal path including a mixer coupled to a local oscillator (LO) signal having an adjustable phase. When the active elements are to be interfaced with an unbalanced antenna, the phase of the LO signal for each signal path coupled to the unbalanced antenna may be adjusted independently of the other signal paths. When the active elements are to be interfaced with a balanced antenna, the phases of the LO signals for the two signal paths coupled to the balanced antenna are adjusted to differ by π radians from each other. The techniques may be applied in either receiver or transmitter applications to provide a flexible interface between an antenna array and an integrated circuit (IC) without the use of baluns.

15 Claims, 9 Drawing Sheets

CONFIGURABLE ANTENNA INTERFACE

BACKGROUND

1. Field

The disclosure relates to the design of systems utilizing antenna arrays, and more particularly, to an interface between an antenna array and a transceiver.

2. Background

Antenna arrays find application in, e.g., communications systems at radio-frequency (RF) and millimeter-wave frequencies, as well as radar systems. The multiple antenna elements provided in an array are used to compensate for communications link losses and to mitigate the effects of multipath propagation. Typically, an antenna array is coupled to a device, e.g., a radio transceiver integrated circuit (IC), containing active elements for processing the signals transmitted and received over the antenna array.

The physical interface between the antenna array and the active elements may be configured based on the type of antenna elements in the array. For example, a dipole antenna element is typically a balanced structure that includes two differential terminals. A patch antenna, on the other hand, may be an unbalanced structure that includes only one terminal referenced to a ground plane.

To properly connect the antenna elements to the active elements, a balun may be required to perform balanced-to-unbalanced or unbalanced-to-balanced transformation. The balun is usually either placed at the antenna feed, prior to interfacing with the active elements, or directly implemented as an active element. A balun generally introduces undesirable insertion losses into the system. Moreover, a balun implemented as an active element may consume significant power, and its bandwidth is limited by the cut-off frequency of the active devices.

It would be desirable to provide techniques for interfacing an antenna array with active elements that can readily accommodate either balanced or unbalanced antenna structures, without additional insertion losses or significant area requirements.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
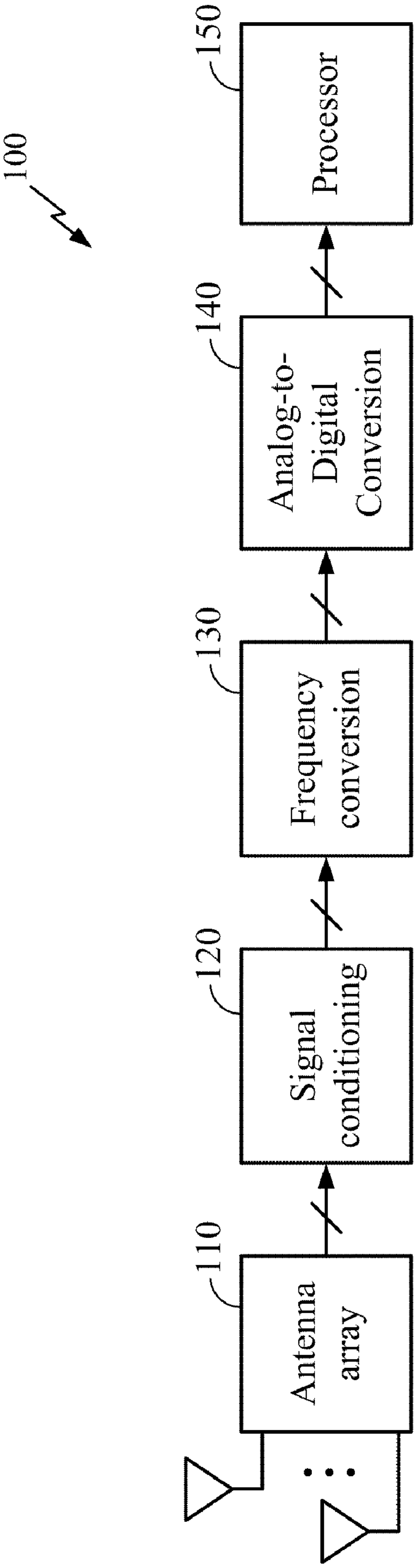
(PRIOR ART) FIG 1
FIG. 1 illustrates a prior art implementation of a receiver for processing signals received over an antenna array.

FIG. 1 illustrates a prior art implementation of a receiver 100 for processing signals received over an antenna array 110. In FIG. 1, the output signals of the antenna array 110 are coupled to a signal conditioning block 120. The signal conditioning block 120 may perform functions such as filtering and amplification on the signals from the antenna array 110. The output signals of the signal conditioning block 120 are coupled to a frequency conversion block 130 which may perform frequency conversion, e.g., frequency down-conversion of the conditioned signals. The output signals of the frequency conversion may subsequently be digitized by an analog-to-digital converter (ADC) 140, and further processed by a processor 150.

One of ordinary skill in the art will appreciate that the architecture of the receiver 100 may be adopted in receivers designed for various applications, e.g., radio-frequency (RF) communications, millimeter-wave communications, and/or radar.

Note FIG. 1 illustrates an example of a prior art system wherein the techniques of the present disclosure may be applied, and is not intended to limit the scope of the present disclosure in any way. The techniques disclosed herein may be applied to systems that omit and/or add to the functional blocks depicted in FIG. 1. For example, the ADC 140 may be omitted in some implementations, and processing done by the processor 150 may be performed directly in the analog domain.

Figure 2:
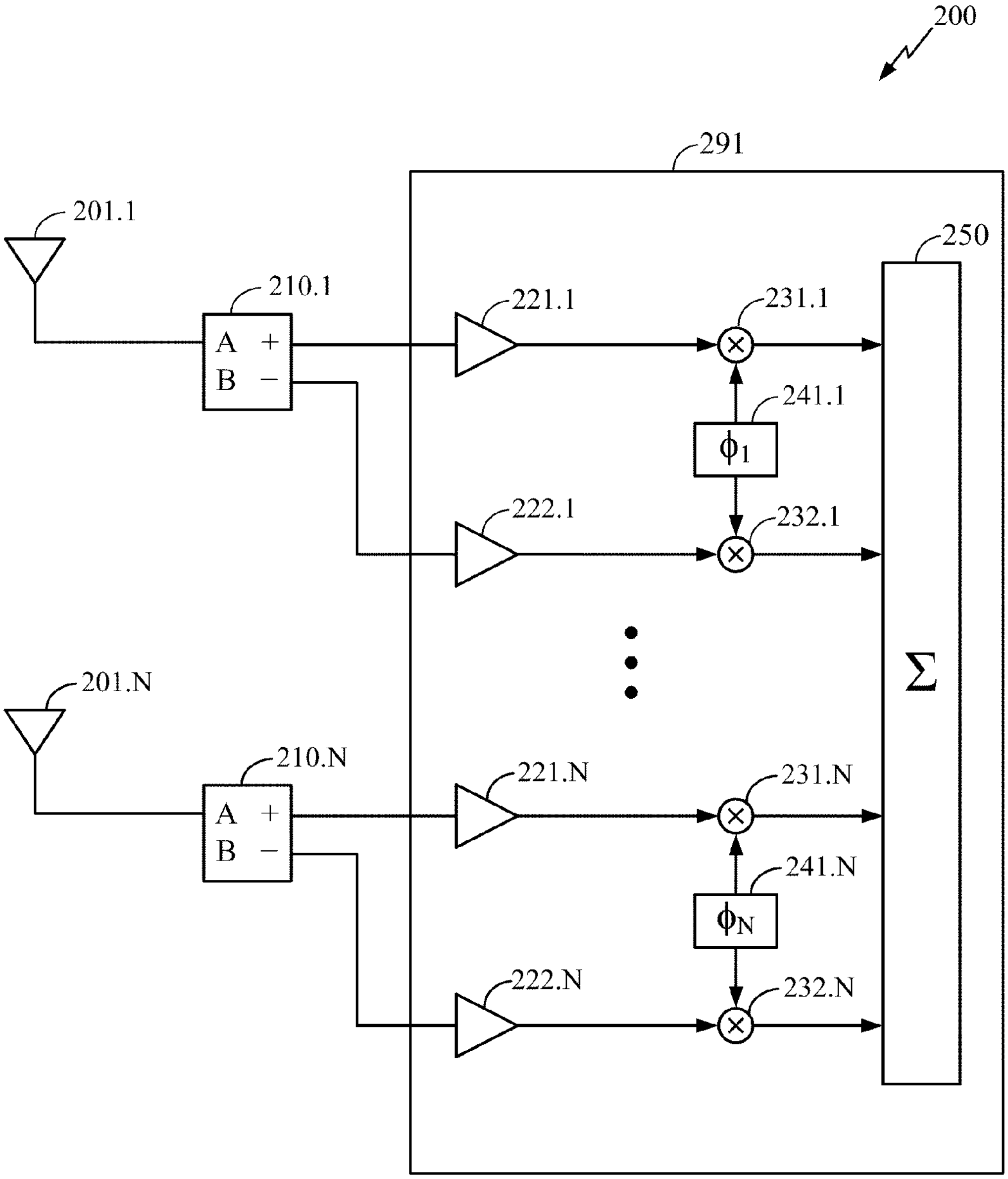
(PRIOR ART) FIG 2
FIG. 2 illustrates a prior art interface between an antenna array having unbalanced antenna elements and a radio transceiver in a communications system.

FIG. 2 illustrates a prior art interface between an antenna array having unbalanced antenna elements and a radio transceiver 291 in a communications system 200.

In FIG. 2, an antenna array includes a plurality N of unbalanced antenna elements 201.1 through 201.N. Each unbalanced antenna element has a single-ended terminal that functions as both the input and output of the antenna element. An example of a type of unbalanced antenna element is a patch antenna. One of ordinary skill in the art will appreciate that in the system 200, a ground plane (not shown) is present that is common to all elements shown. The single terminal of the unbalanced antenna element may be referred to such a ground plane.

Antenna elements 201.1 through 201.N are coupled to the "A" terminals of corresponding balun elements 210.1 through 210.N. A balun element performs an unbalanced-to-balanced transformation from the unbalanced signal at its "A" terminal to a pair of balanced signals at its "+" and "−" terminals, i.e., a single-ended to differential transformation. The transformation is performed such that the difference between the unbalanced signal at the "A" terminal of the balun and a common mode plane is preserved as the difference between the signals at the "+" and "−" terminals of the balun. The "B" terminal in the balun may be coupled, e.g., to the common mode voltage, or directly to the ground plane (e.g., zero common mode voltage).

Each signal emerging from the balun is further coupled to a gain element 221.*n* or 222.*n*, wherein n is an arbitrary index from 1 to N. The signals from the "+" terminals of the baluns are coupled to corresponding gain elements 221.1 through 221.N, while the signals from the "−" terminals of the baluns are coupled to corresponding gain elements 222.1 through 222.N. A gain element may be, e.g., a low-noise amplifier designed to amplify a signal while introducing minimal additional noise. The gain element may also implement additional functions not explicitly shown or described, e.g., further filtering of the input signal prior to or subsequent to amplification, which functions will be clear to one of ordinary skill in the art.

Each signal emerging from a gain element is further coupled to a mixer element 231.*n* or 232.*n*, with the output signals from gain elements 221.1 through 221.N being coupled to corresponding mixer elements 231.1 through 231.N, and the signals from gain elements 222.1 through 222.N being coupled to corresponding mixer elements 232.1 through 232.N. The mixer elements perform frequency conversion, e.g., frequency down-conversion on the outputs of the gain elements to translate the millimeter-wavelength or radio frequency (RF) signals to an intermediate frequency (IF) or baseband frequency for further processing. The frequency conversion at each mixer is accomplished by mixing with a corresponding local oscillator (LO) signal, with the input signals to mixers 231.1 through 231.N and 232.1 through 232.N being mixed with corresponding LO signals generated by LO generators 241.1 through 241.N. The outputs of the mixers 231.1 through 231.N and 232.1 through 232.N are combined by a combiner 250.

One of ordinary skill in the art will appreciate that in a prior art technique known as "beamforming," the phases $\Phi_1$ through $\Phi_N$ of the LO signals generated by the LO generators 241.1 through 241.N may be individually adjusted to optimally combine the mixer outputs at the combiner 250. For example, the signals corresponding to the antenna element 201.1 may be multiplied by an LO signal having a first phase $\Phi_1$, and the signals derived from the antenna element 201.2 may be mixed with an LO signal having a second phase $\Phi_2$, with $\Phi_1$ and $\Phi_2$ having a difference that accounts for, e.g., a phase difference between the signals received by the two antenna elements. Generalizations of beamforming to an arbitrary plurality N of antenna elements are well-known to one of ordinary skill in the art, and will not be further described herein.

In one implementation, the elements provided in the RF transceiver 291 may be denoted as "active" elements, and the RF transceiver 291 may be, e.g., an integrated circuit (IC). In FIG. 2, the balun elements 210.1 through 210.N are shown as passive elements provided separately from the antenna elements and the active elements. Alternatively, the balun elements 210.1 through 210.N may also be active elements provided on the IC.

Figure 3:
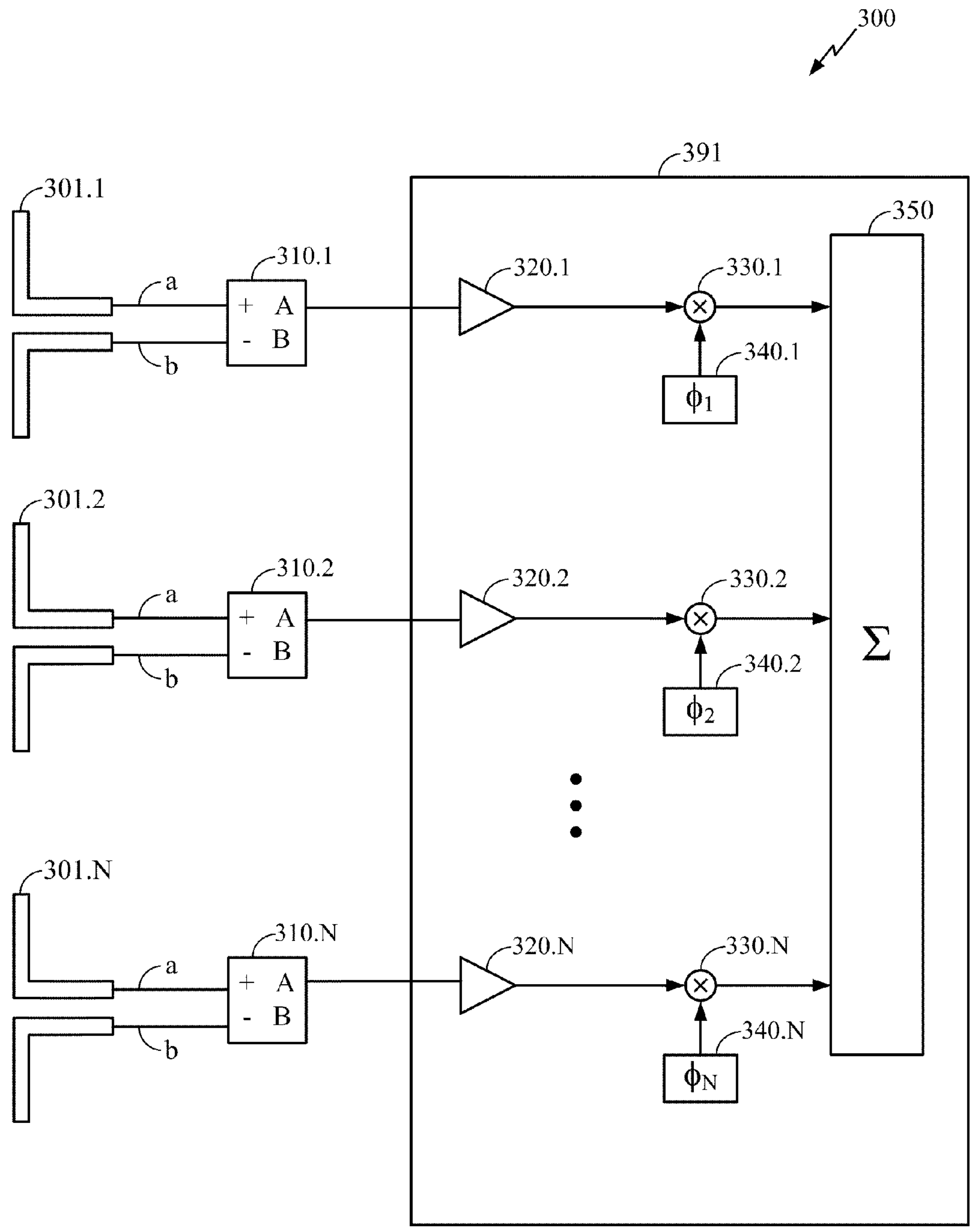
(PRIOR ART) FIG 3
FIG. 3 illustrates a prior art interface between an antenna array having balanced antenna elements and a radio transceiver in a communications system.

FIG. 3 illustrates a prior art interface between an antenna array having balanced antenna elements and a radio transceiver 391 in a communications system 300.

In FIG. 3, an antenna array includes a plurality N of balanced antenna elements 301.1 through 301.N. Each balanced antenna element has two differential terminals labeled "a" and "b", with the signal input and output of the antenna element provided as the difference between the signals at the differential terminals. An example of a type of balanced antenna element is a dipole antenna.

In FIG. 3, the "a" terminals of the balanced antenna elements 301.1 through 301.N are coupled to the "+" terminals of corresponding balun elements 310.1 through 310.N, while the "b" terminals are coupled to the "−" terminals of those balun elements. Each balun element converts the difference between its "+" and "−" terminals into an unbalanced signal made available at its "A" terminal, wherein the unbalanced common mode signal may be referenced to, e.g., the ground plane at the B terminal. In this manner, the balun element performs a balanced-to-unbalanced transformation, i.e., a differential-to-single-ended transformation.

The unbalanced signals emerging from the "A" terminals of balun elements 310.1 through 310.N are further coupled to corresponding gain elements 320.1 through 320.N, and followed by corresponding mixer elements 330.1 through 330.N. Mixer elements 330.1 through 330.N perform mixing with corresponding LO signals generated by LO generators 340.1 through 340.N. The outputs of the mixers 330.1 through 330.N are combined by a combiner 350.

It will be appreciated that in an implementation of beamforming using the system 300, the phases $\Phi_1$ through $\Phi_N$ of the LO signals may be adjusted independently to optimally combine the mixer outputs at the combiner 350.

It will be appreciated from the above descriptions of FIGS. 2 and 3 that the connectivity between the antenna elements and the active elements, i.e., through the balun elements 210.1 through 210.N or 310.1 through 310.N shown, depends on whether the particular antenna elements of the antenna array are unbalanced or balanced. Thus, a radio transceiver architecture that is designed to support one type of antenna element may not be flexible enough to support a different type of antenna element. Furthermore, one of ordinary skill in the art will appreciate that implementing the balun elements shown may undesirably introduce losses into the system, and that implementing the balun elements as active elements in the radio transceiver 291 or 391 may additionally consume significant die area in an IC. It would be desirable to provide techniques to interface the antenna elements with the active elements in a readily configurable manner that can accommodate either balanced or unbalanced antenna elements. It would be further desirable to minimize insertion losses and die area consumed using such techniques.

Figure 4:
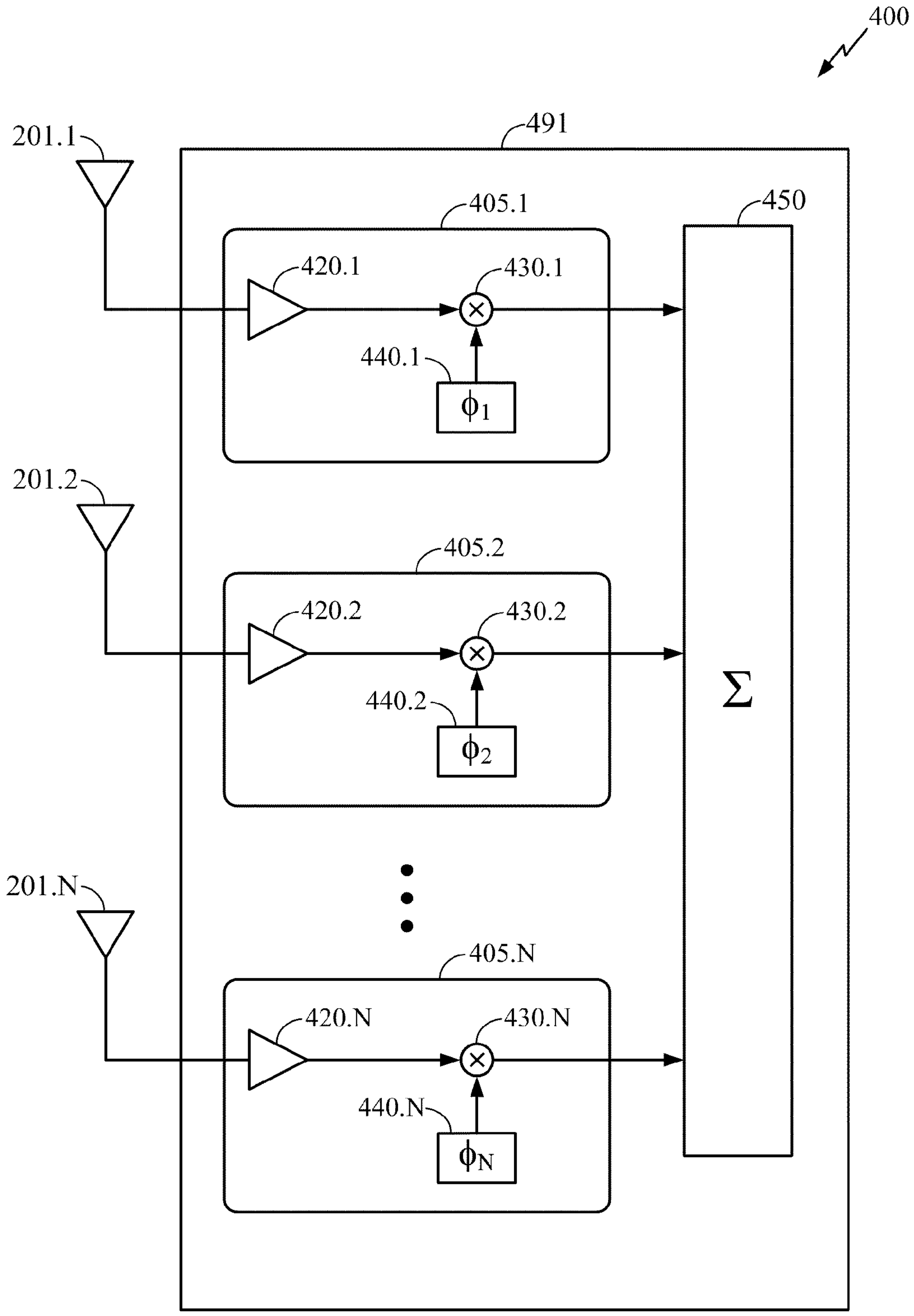
FIG. 4 illustrates an exemplary embodiment of an interface between multiple unbalanced antenna elements and active elements in a receiver for a communications system.

FIG. 4 illustrates an exemplary embodiment of an interface between multiple unbalanced antenna elements and active elements 491 in a receiver 400 for a communications system.

In FIG. 4, unbalanced antenna elements 201.1 through 201.N are coupled to a set of active elements 491. The active elements 491 of the receiver 400 include gain elements 420.1 through 420.N, followed by corresponding mixer elements 430.1 through 430.N that mix the outputs of the gain elements with corresponding LO signals generated by LO generators 440.1 through 440.N. The outputs of the mixers 430.1 through 430.N are combined by a combiner 450. Each combination of a gain element 420.*n*, mixer element 430.*n*, and LO generator 440.*n* makes up a signal path 405.*n*, with the receiver 400 including N distinct signal paths 405.1 through 405.N.

In FIG. 4, the phase $\Phi_n$ of each LO signal generated by LO generators 440.1 through 440.N may be adjusted independently of the phase of the other LO signals. In an exemplary embodiment, the phase $\Phi_n$ of each LO signal may be digitally programmed into the corresponding LO generator. For example, each of the LO generators 440.1 through 440.N may be provided with a register (not shown) specifying a phase of the LO signal to be generated. In an exemplary embodiment, the phase may be digitally specified using five bits that completely span a full cycle of $2\pi$ radians.

Figure 4A:
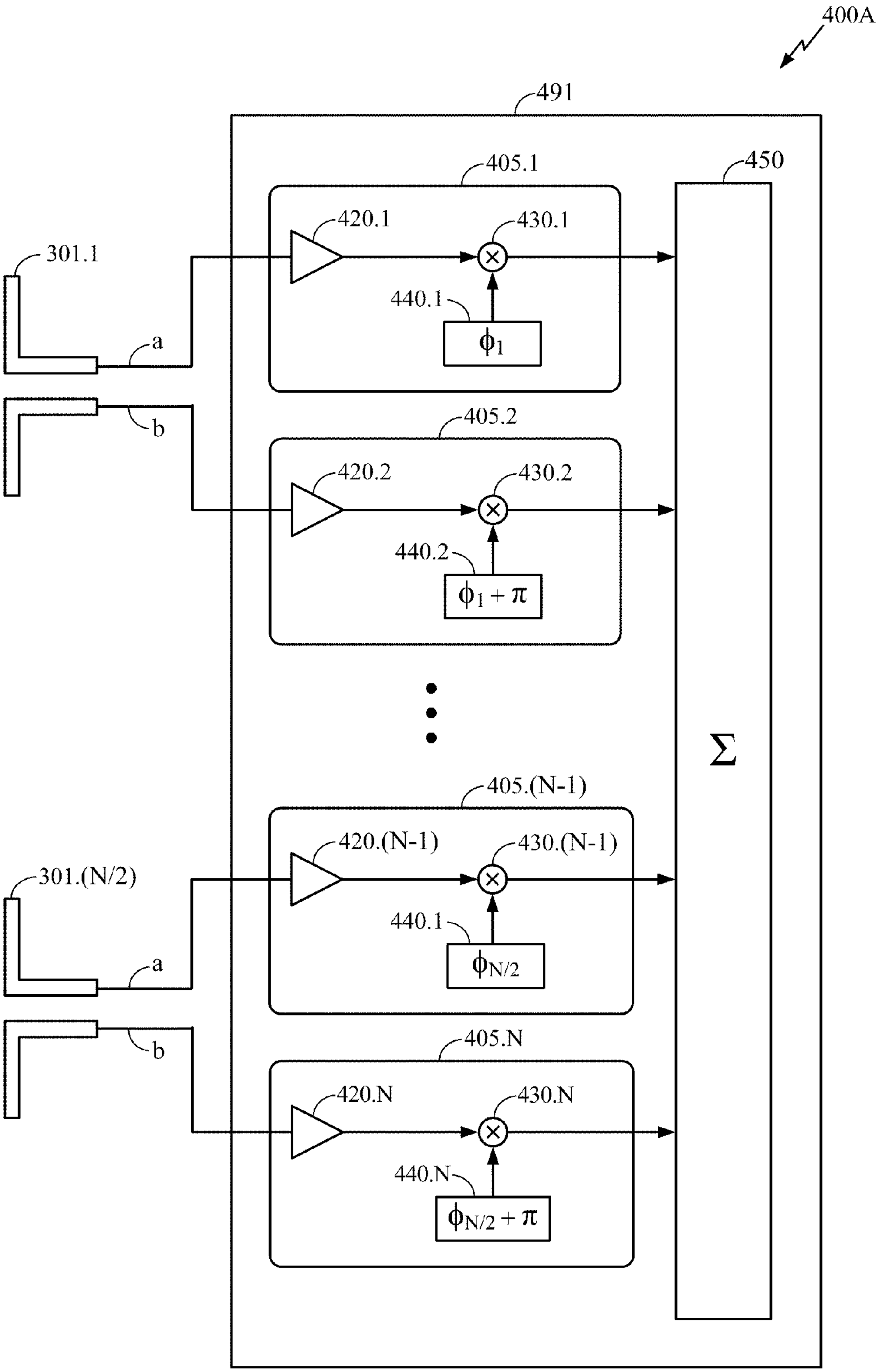
FIG. 4A illustrates an exemplary embodiment of an interface between multiple balanced antenna elements and active elements in a receiver.

FIG. 4A illustrates an exemplary embodiment of an interface between multiple balanced antenna elements and active elements 491 in a receiver 400A. The active elements 491 may correspond to the same active elements 491 used in the receiver 400 shown in FIG. 4, with differing values provided for the LO phases $\Phi_1$ through $\Phi_N$ as further described hereinbelow.

In FIG. 4A, balanced antenna elements 301.1 through 301.(N/2) are coupled to the active elements. Each of the "a" and "b" terminals of each balanced antenna element is coupled to a corresponding one of the signal paths 405.1 through 405.N, with the two terminals of a single balanced antenna coupled to two signal paths, as shown. Furthermore, for the two signal paths corresponding to a single balanced antenna, the LO phases are adjusted to differ by exactly it radians. One of ordinary skill in the art will appreciate that this effectively introduces a phase inversion between the outputs of the two signal paths corresponding to a single balanced antenna. Thus by appropriately adjusting the phases $\Phi_1$ through $\Phi_{N/2}$ of the LO generators 440.1 through 440.N, the same set of active elements 491 may be configured to accommodate either unbalanced or balanced antenna elements without any hardware modification, and without the need for any baluns. This advantageously avoids the possible losses and area trade-offs associated with the use of baluns.

It will be appreciated that the techniques of the present disclosure may be especially suitable for use in millimeter-wave based communications systems. In such systems, the bandwidths of a typical communications channel may be on the order of GHz, and thus the active elements in the signal paths may already be designed to accommodate signal bandwidths on the order of GHz. To accommodate such bandwidths using prior art techniques such as passive baluns may undesirably consume excessive area and/or cost, since passive baluns generally have limited bandwidth, and may require the provisioning of multiple sections at the expense of area and cost.

A further advantage of the techniques of the present disclosure is that the active elements in the signal paths, e.g., the gain elements or mixer elements, may be configurable to be well-matched to each other, such that the overall system exhibits good broadband common-mode rejection characteristics.

Figure 4B:
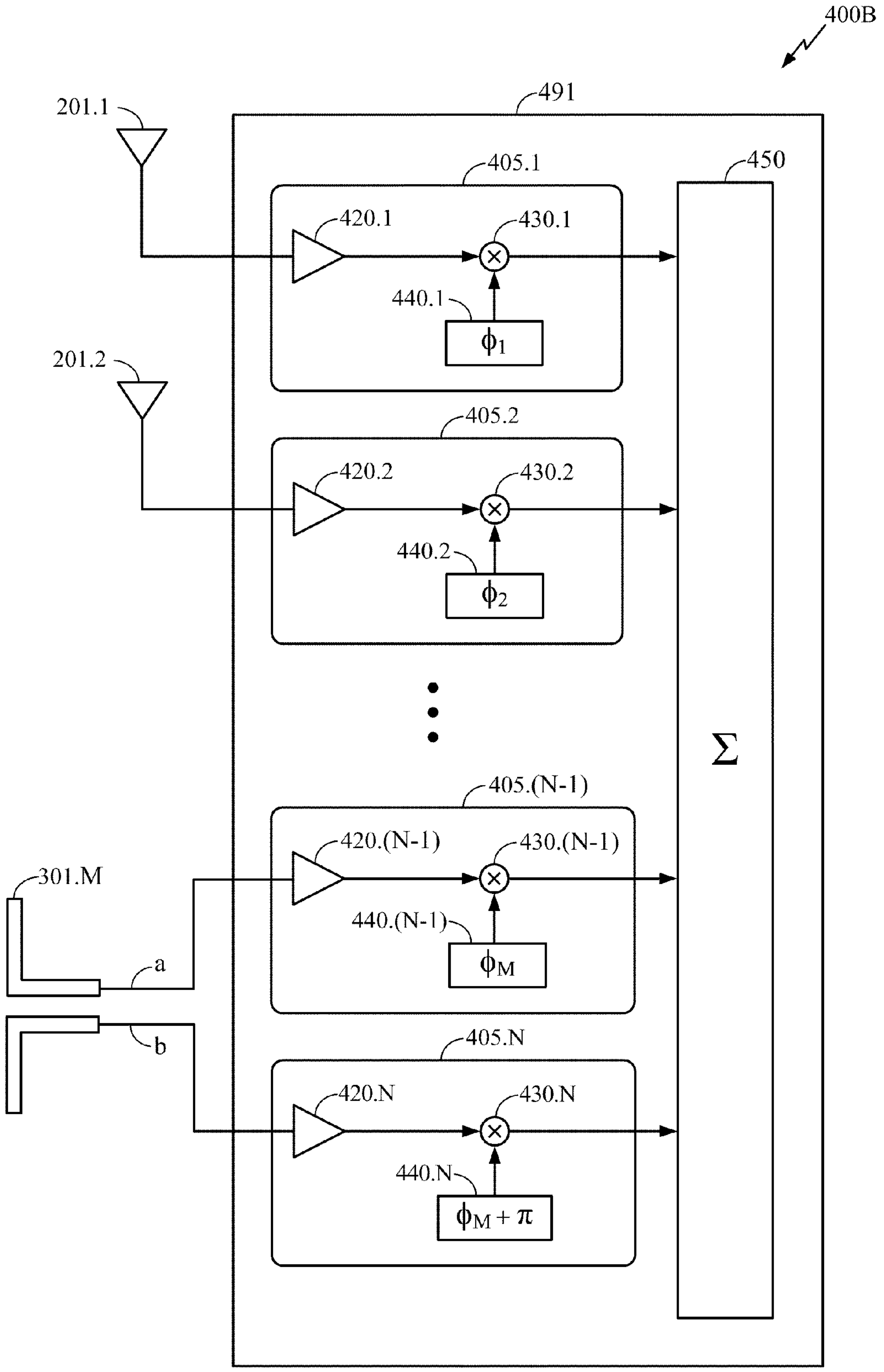
FIG. 4B illustrates an exemplary embodiment of an interface between an antenna array and active elements in a receiver, with the antenna array including at least one unbalanced antenna and at least one balanced antenna.

In a further exemplary embodiment of the present disclosure, the flexibility of the architecture described hereinabove allows the design of systems that may simultaneously accommodate both unbalanced and balanced antenna elements. FIG. 4B illustrates an exemplary embodiment of an interface between an antenna array and active elements in a receiver 400B, with the antenna array including at least one unbalanced antenna and at least one balanced antenna.

In FIG. 4B, unbalanced antenna elements 201.1 and 201.2 are coupled to signal paths 405.1 and 405.2, respectively. The phases $\Phi_1$ and $\Phi_2$ the LO generators 440.1 and 440.2 may be independently adjusted in accordance with the principles of the present disclosure to accommodate the unbalanced antenna elements. Furthermore, terminals "a" and "b" of a balanced antenna element 301.M are coupled to signal paths 405.(N−1) and 405.N, respectively. As shown in FIG. 4B, the phases of the LO generators 440.(N−1) and 440.N are adjusted to vary in one degree of freedom $\Phi_M$, and to differ from each other by $\pi$ radians.

It will be appreciated that while exemplary embodiments of the present disclosure have been described with reference to processing of the signals from an antenna array at a receiver, the techniques herein may also be readily applied to the interface between a transmitter and an antenna array. For example, the phase of an LO signal used for upconverting a baseband signal in a TX signal path may also be made adjustable, and unbalanced and/or balanced antenna elements may be accommodated by appropriately selecting the phases of the LO signals used for upconversion.

Figure 5:
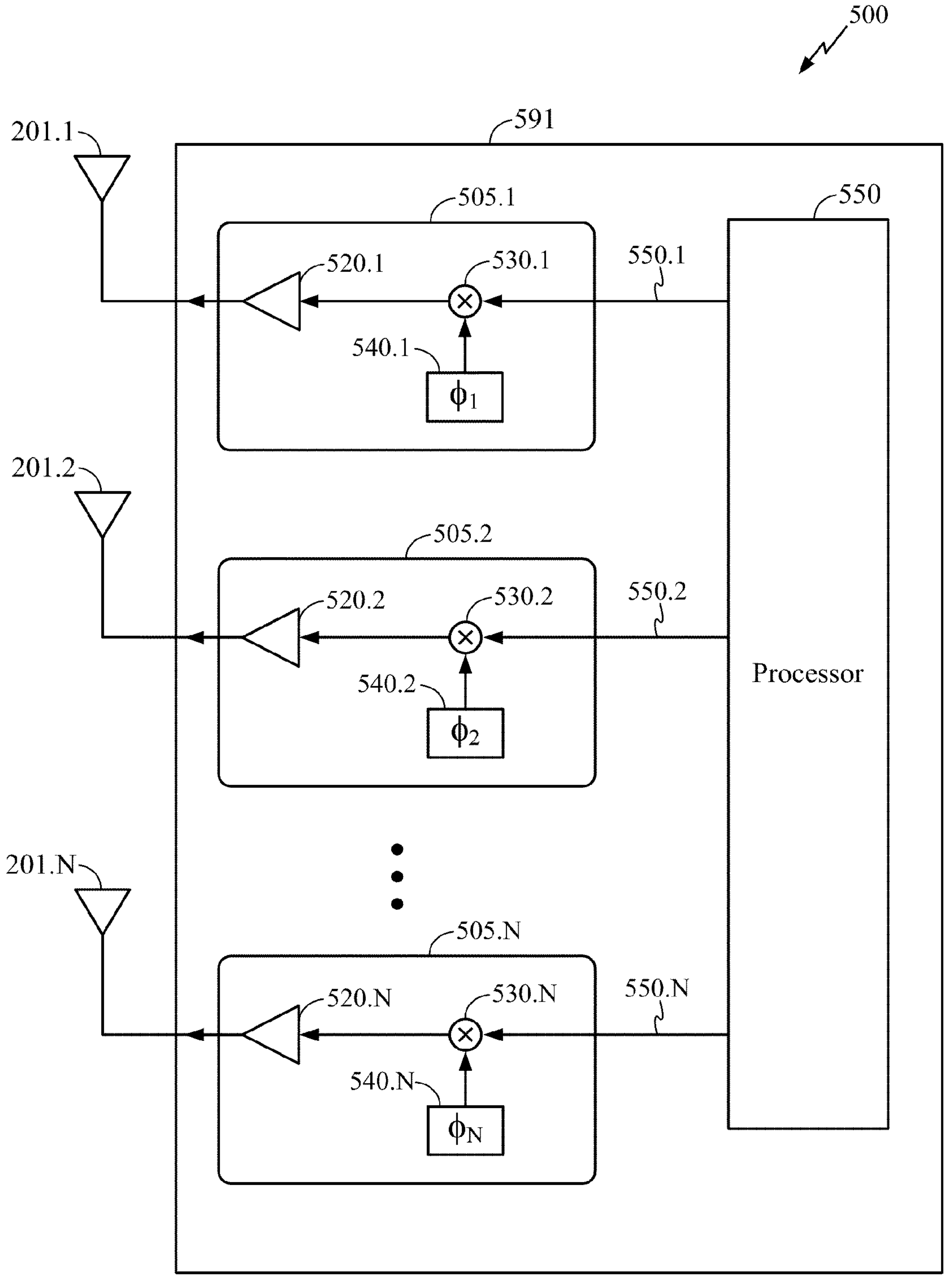
FIGS. 5 and 5A illustrate exemplary embodiments of an interface between multiple unbalanced antenna elements and active elements in a transmitter for a communications system.
Figure 5A:
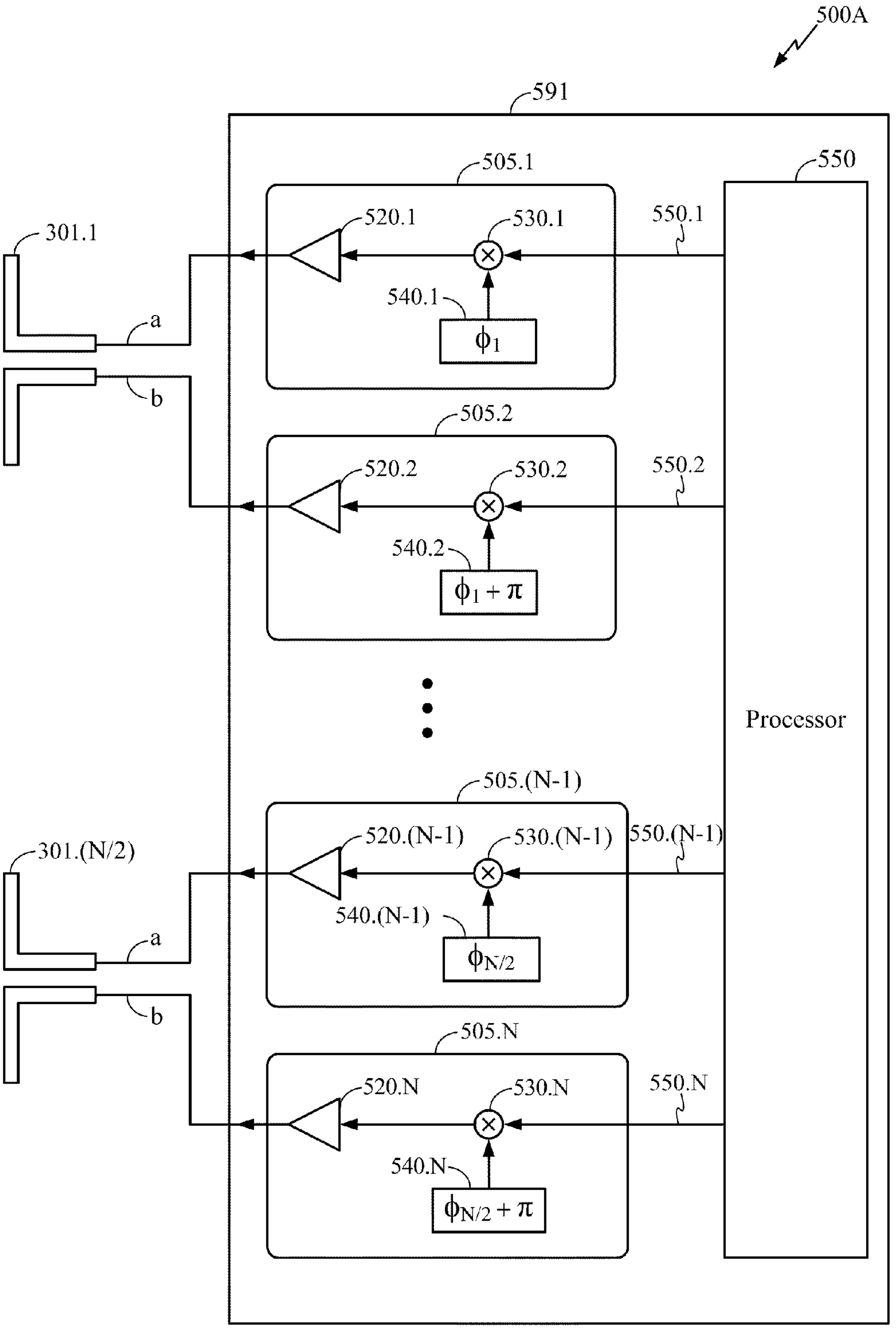

FIGS. 5 and 5A illustrate exemplary embodiments of an interface between multiple antenna elements and active elements 591 in a transmitter for a communications system.

In FIG. 5, unbalanced antenna elements 201.1 through 201.N are coupled to a set of active elements 591. The active elements 591 include a processor 550 for generating a plurality of baseband signals 550.1 through 550.N coupled to a plurality of corresponding mixers 530.1 through 530.N. The mixers 530.1 through 530.N perform upconversion of the baseband signals by mixing with corresponding LO signals generated by LO generators 540.1 through 540.N. As earlier described herein, the LO signals are adjustable with corresponding phase offsets $\Phi_1$ through $\Phi_N$. The outputs of the mixers are coupled to corresponding gain elements 520.1 through 520.N, which may perform amplification of the mixer output prior to coupling with the plurality of antenna elements 201.1 through 201.N.

In FIG. 5A, balanced antenna elements 301.1 through 301.N are coupled to a set of active elements 591. The active elements 591 may be identical to those shown in FIG. 5. The outputs gain elements 520.1 through 520.N are coupled to differential terminals a and b of balanced antenna elements 301.1 through 301.(N/2). As earlier described with reference to the receiver architecture in FIG. 4A, the phases of the two LO signals in the signal paths provided to the same balanced antenna element 301.*n* may be adjusted to vary in one degree of freedom $\Phi_M$, and to differ from each other by $\pi$ radians.

One of ordinary skill in the art will appreciate that the active elements 591 may also be configured to accommodate mixed sets of balanced and unbalanced antenna elements for transmission over an antenna array, as described in FIG. 4B in the context of reception. It will further be appreciated that in alternative exemplary embodiments (not shown), a single set of active elements may simultaneously accommodate both transmit and receive signal paths to a plurality of antenna elements by using, e.g., a duplexer or other means known to one of ordinary skill in the art. Such alternative exemplary embodiments are contemplated to be within the scope of the present disclosure.

Figure 6:
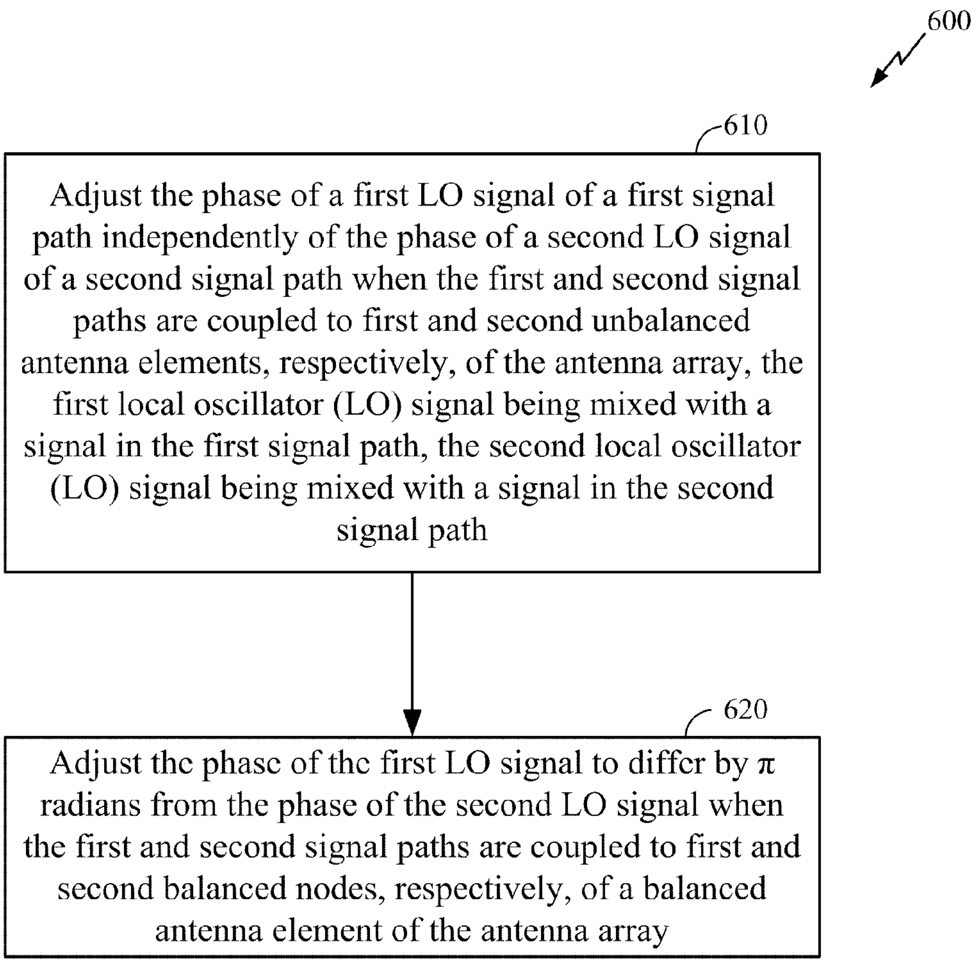
FIG. 6 illustrates an exemplary embodiment of a method according to the present disclosure.

FIG. 6 illustrates an exemplary embodiment of a method 600 according to the present disclosure. Note the method is shown for illustrative purposes only, and is not meant to limit the scope of the present disclosure to any particular method described. The method shown is for interfacing a plurality of signal paths with an antenna array.

At block 610, the phase of a first LO signal of a first signal path is adjusted independently of the phase of a second LO signal of a second signal path when the first and second signal paths are coupled to first and second unbalanced antenna elements, respectively, of the antenna array, the first local oscillator (LO) signal being mixed with a signal in the first signal path, the second local oscillator (LO) signal being mixed with a signal in the second signal path.

At block 620, the phase of the first LO signal is adjusted to differ by $\pi$ radians from the phase of the second LO signal when the first and second signal paths are coupled to first and second balanced nodes, respectively, of a balanced antenna element of the antenna array.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method for interfacing a plurality of signal paths with an antenna array, the method comprising:

adjusting the phase of a first LO signal of a first signal path independently of the phase of a second LO signal of a second signal path when the first and second signal paths are coupled to first and second unbalanced antenna elements, respectively, of the antenna array, the first local oscillator (LO) signal being mixed with a signal in the first signal path, the second local oscillator (LO) signal being mixed with a signal in the second signal path; and adjusting the phase of the first LO signal to differ by $\pi$ radians from the phase of the second LO signal when the first and second signal paths are coupled to first and second balanced nodes, respectively, of a balanced antenna element of the antenna array.

2. The method of claim 1, further comprising:

adjusting the phase of each first LO signal of a plurality of first signal paths independently of the phase of each second LO signal of a plurality of second signal paths when said first and second signal paths are each coupled to unbalanced antenna elements, respectively, of the antenna array, each first LO signal being mixed with a signal in the corresponding first gain path, each second LO signal being mixed with a signal in the corresponding second gain path; and adjusting the phase of each first LO signal to differ by π radians from the phase of a corresponding second LO signal when said plurality of first and second signal paths are coupled to balanced nodes of balanced antenna elements of the antenna array.

3. The method of claim 1, further comprising:

transmitting a signal generated by each of the plurality of signal paths over the antenna array.

4. The method of claim 3, further comprising jointly programming the phases of the LO signals of each of the signal paths to maximize an output of the antenna array in a transmitter beamforming application.

5. The method of claim 1, further comprising:

receiving a signal from each antenna element of the antenna array using the signal paths.

6. The method of claim 5, further comprising:

combining the outputs of the signal paths using a combiner; and jointly programming the phases of the LO signals of each of the signal paths to maximize the combiner output in a receiver beamforming application.

7. An apparatus comprising active elements for interfacing with an antenna array, the active elements comprising:

an LO generator for a first signal path configured to generate a first LO signal having an adjustable phase, the first LO signal configured to be mixed with a signal of the first signal path;

an LO generator for a second signal path configured to generate a second LO signal having an adjustable phase, the second LO signal configured to be mixed with a signal of the second signal path, the phase of the first LO signal configured to be adjusted independently of the phase of the second LO signal when the first and second signal paths are coupled to first and second unbalanced antenna elements, respectively, of the antenna array, the phase of the first LO signal further configured to differ by π radians from the phase of the second LO signal when the first and second signal paths are coupled to first and second balanced nodes, respectively, of a balanced antenna element of the antenna array.

8. The apparatus of claim 7, the active elements further comprising additional pairs of first and second signal paths, the phase of an LO signal of each of the first signal paths configured to be adjusted independently of the phase of the LO signal of each of the corresponding second signal paths when said first and second signal paths are each coupled to unbalanced antenna elements of the antenna array, the phase of the LO signal of each of the first signal paths further configured to differ by π radians from the phase of the LO signal of each of the corresponding second signal paths when said first and second signal paths are coupled to balanced nodes of a balanced antenna element of the antenna array.

9. The apparatus of claim 8, further comprising a processor configured to jointly program the phases of the LO signals of each of the signal paths to maximize a combiner output in a receiver beamforming application.

10. The apparatus of claim 7, the active elements being disposed on an integrated circuit (IC), the apparatus further comprising the antenna array electrically coupled to the integrated circuit.

11. The apparatus of claim 7, the signal of the first signal path configured to be mixed with the first LO signal comprising the output of a gain element in the first signal path.

12. The apparatus of claim 8, further comprising a processor configured to jointly program the phases of the LO signals of each of the signal paths to maximize the output of the antenna array in a transmitter beamforming application.

13. The apparatus of claim 7, the active elements being disposed on an integrated circuit (IC), the apparatus further comprising the antenna array electrically coupled to the integrated circuit.

14. An apparatus comprising active elements for interfacing with an antenna array, the active elements comprising:

means for adjusting a phase of an LO signal of each of a plurality of first and second signal paths to accommodate either a balanced or unbalanced antenna element coupled to the plurality of signal paths.

15. A computer program product storing code for causing a computer to program the phase of a plurality of signal paths to be interfaced with an antenna array, the code comprising:

code for causing a computer to program the phase of a first LO signal of a first signal path independently of the phase of a second LO signal of a second signal path when the first and second signal paths are coupled to first and second unbalanced antenna elements, respectively, of the antenna array, the first local oscillator (LO) signal being mixed with a signal in the first signal path, the second local oscillator (LO) signal being mixed with a signal in the second signal path; and code for causing a computer to program the phase of the first LO signal to differ by π radians from the phase of the second LO signal when the first and second signal paths are coupled to first and second balanced nodes, respectively, of a balanced antenna element of the antenna array.

* * * * *